(12) United States Patent
Herrmann

(10) Patent No.: US 11,271,140 B2
(45) Date of Patent: Mar. 8, 2022

(54) METHOD FOR MANUFACTURING A PLURALITY OF SURFACE MOUNTED OPTOELECTRONIC DEVICES AND SURFACE MOUNTED OPTOELECTRONIC DEVICE

(71) Applicant: OSRAM Opto Semiconductors GmbH, Regensburg (DE)

(72) Inventor: Siegfried Herrmann, Neukirchen (DE)

(73) Assignee: OSRAM OLED GMBH, Regensburg (DE)

( * ) Notice: Subject to any disclaimer, the term of this patent is extended or adjusted under 35 U.S.C. 154(b) by 139 days.

(21) Appl. No.: 16/498,291

(22) PCT Filed: Mar. 20, 2018

(86) PCT No.: PCT/EP2018/057045
§ 371 (c)(1),
(2) Date: Sep. 26, 2019

(87) PCT Pub. No.: WO2018/177818
PCT Pub. Date: Oct. 4, 2018

(65) Prior Publication Data
US 2020/0052165 A1     Feb. 13, 2020

(30) Foreign Application Priority Data
Mar. 29, 2017   (DE) .......................... 102017106761.2

(51) Int. Cl.
*H01L 33/48* (2010.01)
*H01L 33/00* (2010.01)
(Continued)

(52) U.S. Cl.
CPC .......... *H01L 33/486* (2013.01); *H01L 33/005* (2013.01); *H01L 33/58* (2013.01);
(Continued)

(58) Field of Classification Search
CPC ..... H01L 33/486; H01L 33/005; H01L 33/58; H01L 33/62; H01L 2933/0033; H01L 2933/066
See application file for complete search history.

(56) References Cited

U.S. PATENT DOCUMENTS 10,276,748 B2   4/2019  Kaempf et al.
2009/0108283 A1*  4/2009  Kadotani .................. F21K 9/61
                                                257/98
(Continued)

FOREIGN PATENT DOCUMENTS

CN    205645875 U    10/2016
DE    102014114613 A1  4/2016
(Continued)

*Primary Examiner* — Lex H Malsawma
*Assistant Examiner* — Xia L Cross
(74) *Attorney, Agent, or Firm* — Slater Matsil, LLP

(57) ABSTRACT

A method for manufacturing a plurality of surface mounted optoelectronic devices and a surface mounted optoelectronic device are disclosed. In an embodiment, a surface mounted optoelectronic device includes a transparent base body having a mounting rear side, a radiation exit side opposite the mounting rear side, and mounting side surfaces which are each disposed transversely to the radiation exit side, a semiconductor layer sequence disposed laterally to at least one mounting side surface and a terminal contact extending from the at least one mounting side surface to the mounting rear side, wherein the semiconductor layer sequence includes an active region configured to emit radiation so that the radiation decouples from the surface mounted optoelectronic device via the radiation exit side of the base body.

17 Claims, 12 Drawing Sheets

(51) Int. Cl.
*H01L 33/58* (2010.01)
*H01L 33/62* (2010.01)

(52) U.S. Cl.
CPC ...... *H01L 33/62* (2013.01); *H01L 2933/0033* (2013.01); *H01L 2933/0066* (2013.01)

(56) References Cited

U.S. PATENT DOCUMENTS

| | | |
|---|---|---|
| 2011/0122341 A1 | 5/2011 | Hayashi |
| 2011/0180818 A1 | 7/2011 | Lerman et al. |
| 2013/0207144 A1* | 8/2013 | Ramchen ............ H01L 31/0203 |
| | | 257/98 |
| 2017/0047486 A1 | 2/2017 | Herrmann et al. |
| 2017/0141278 A1* | 5/2017 | Hamaguchi ............ H01L 33/62 |
| 2018/0249578 A1 | 8/2018 | Singer et al. |

FOREIGN PATENT DOCUMENTS

| | | |
|---|---|---|
| DE | 102016119539 A1 | 4/2018 |
| DE | 102017103828 A1 | 8/2018 |
| GB | 2498347 A | 7/2013 |

\* cited by examiner

METHOD FOR MANUFACTURING A PLURALITY OF SURFACE MOUNTED OPTOELECTRONIC DEVICES AND SURFACE MOUNTED OPTOELECTRONIC DEVICE

This patent application is a national phase filing under section 371 of PCT/EP2018/057045, filed Mar. 20, 2018, which claims the priority of German patent application 102017106761.2, filed Mar. 29, 2017, each of which is incorporated herein by reference in its entirety.

TECHNICAL FIELD

The invention relates to a method for manufacturing a plurality of surface mounted optoelectronic devices. The invention further relates to a surface mounted optoelectronic device.

BACKGROUND

Optoelectronic devices, such as LEDs, can have a volume radiation body that is highly efficient. Unfortunately, due to simple chip technology, current distribution and high current capability are only moderate to poor.

SUMMARY OF THE INVENTION

Embodiments provide a method for manufacturing a plurality of surface mounted optoelectronic devices which have a large radiation exit surface, whereby in particular the radiation is decoupled in an evenly distributed manner over the radiation exit surface. Further embodiments provide a surface mounted optoelectronic device with these advantageous properties.

In at least one embodiment, the method for manufacturing a plurality of surface mounted optoelectronic devices comprises the steps of:

A) providing a plurality of transparent base bodies each having a mounting rear side, a radiation exit side opposite the mounting rear side, and mounting side surfaces each disposed transversely to the radiation exit side, B) depositing a terminal contact on at least one mounting side surface and to the mounting rear side of the respective base body, so that the device can be surface-mounted, the terminal contact being arranged to electrically contact a semiconductor layer sequence, and C) depositing the semiconductor layer sequence on at least one mounting side surface of the respective base body which is arranged to emit electromagnetic radiation, the electromagnetic radiation being decoupled from the device during operation via the radiation exit side of the base body. In particular, the semiconductor layer sequence is deposited on the mounting side surface to which the terminal contact was applied in the previous method step B).

The embodiments of the invention also relate to a surface mounted optoelectronic device. Preferably, this surface mounted optoelectronic device is produced with the method described herein. All embodiments and definitions for the method also apply to the device and vice versa.

According to at least one embodiment, the surface mounted optoelectronic device, herein also referred to simply as a device, has a transparent base body. The transparent base body has a mounting rear side and a radiation exit side opposite the mounting rear side and mounting side surfaces. The mounting side surfaces are disposed transverse to the radiation exit side. The device has a semiconductor layer sequence. The semiconductor layer sequence is disposed laterally to at least one mounting side surface. The device has a terminal contact. The terminal contact extends from at least the mounting side surface to the mounting rear side. In particular, the mounting rear side is completely covered by the terminal contact, while the mounting side surface is only partially covered by the terminal contact. The surface not covered by the terminal contact from the mounting side can, for example, be filled with a filler in order to avoid unevenness during the subsequent deposition of the semiconductor layer sequence. The semiconductor layer sequence has an active region. The active region is arranged for radiation emission. The radiation of the active region is decoupled from the device via the radiation exit side of the base body.

The inventor has discovered that this method can be used to provide an optoelectronic device, in particular an LED, with high efficiency. In particular, hybrid chip technology is used in this method. Hybrid chip technology here means the UX:3 technology with extended transparent emission ranges and finger contacts. The conductor tracks can be continued finger-shaped in the emission areas outside the SMT mounting area. It could also only be a sapphire chip if, for example, only the finger-shaped part is viewed.

The emission direction can take place in both sides (large surface) of the semiconductor chip.

The inventor has recognized that the emission area of the optoelectronic device can be increased by the embodiment of the optoelectronic device produced here. In addition, the emitted radiation is evenly distributed over a large area and is thus evenly decoupled from the device. The current carrying capacity increases despite lower shading compared to standard sapphire technology. In particular, the devices, i.e., the semiconductor layer sequence and/or the device, are all bond wire-free.

According to at least one embodiment, the method has a step in which a plurality, i.e., at least two or more than two, of transparent base bodies are provided. The base body can be made of plastic, ceramic or glass. The base body has a mounting rear side, a radiation exit surface opposite the mounting rear side and mounting side surfaces. The mounting side surfaces are disposed transverse to the radiation exit side. In other words, the base body is formed as a cuboid or cube. The base body is transparent for the radiation emitted by a semiconductor layer sequence. In particular, the devices are manufactured in a so-called wafer composite.

According to at least one embodiment, the method has the step of depositing a terminal contact on at least one mounting side surface. Alternatively or additionally, the terminal contact is also deposited on the mounting rear side of the respective base body. This makes the device surface mountable.

As an alternative or in addition, the device also has a second terminal contact. The terminal contacts are arranged for electrical contacting of the semiconductor layer sequence. In particular, one terminal contact contacts an n-doped semiconductor layer of the semiconductor layer sequence, while the other terminal contact electrically contacts a p-doped semiconductor layer of the semiconductor layer sequence. Between the at least one p-doped semiconductor layer and the at least one n-doped semiconductor layer, an active layer or an active region arranged for radiation emission is disposed.

"Surface-mountable device" means herein in particular that the terminal contacts lie in a common plane. The terminal contacts or the terminal contact are arranged to be disposed on a common mounting plane. Therefore the terminal contacts or the terminal contact are suitable for so-called SMT (Surface Mounted Technology) technology. SMT technology is sufficiently well known to the skilled person and is therefore not explained in detail here.

In particular, the special SMT connection technology is connected via a light distribution plate. This connection concept allows the close juxtaposition of a plurality of devices. Coarsely pixeled matrices can thus be provided.

According to at least one embodiment, the method comprises a step C) of depositing the semiconductor layer sequence on at least one mounting side surface of the respective base body. The semiconductor layer sequence is arranged to emit electromagnetic radiation. The semiconductor layer sequence is thus arranged during operation to emit radiation. A wavelength, maximum wavelength or peak wavelength of radiation is preferably in the ultraviolet and/or visible spectral range, in particular at wavelengths between 420 nm and 680 nm inclusive, for example, between 440 nm and 480 nm inclusive.

According to at least one embodiment, the semiconductor layer sequence is preferably based on a III-V compound semiconductor material. The semiconductor material is, for example, a nitride compound semiconductor material such as AlnIn1-n-mGamN or a phosphide compound semiconductor material such as AlnIn1-n-mGamP or also an arsenide compound semiconductor material such as AlnIn1-n-mGamAs, where respectively 0≤n≤1, 0≤m≤1 and n+m≤1. The semiconductor layer sequence may contain dopants as well as additional components. For the sake of simplicity, however, only the essential components of the crystal lattice of the semiconductor layer sequence are given, i.e., Al, As, Ga, In, N or P, even if these may be partially replaced and/or supplemented by small quantities of other substances.

The semiconductor layer sequence includes an active layer or active region with at least one pn junction and/or with one or more quantum well structures.

According to at least one embodiment, the semiconductor layer sequence is part of a semiconductor chip. In particular, the semiconductor chip is a light-emitting diode, or LED for short. The semiconductor chip is preferably arranged to emit blue, red, green or white light.

The semiconductor chip can have a conversion layer. The conversion layer is preferably disposed directly on the semiconductor layer sequence. "Direct" here and in the following means direct mechanical and/or direct electrical contact, i.e., that no further layers or elements are disposed between one element and the other element. The conversion can be complete (full conversion) or partial (partial conversion).

Preferably, the semiconductor layer sequence emits blue light, the conversion element being arranged to convert the blue radiation into red and green radiation. The radiation of the conversion layer and the radiation of the semiconductor layer sequence thus couple into the transparent base body as white light, whereby the white light is coupled out of the device via the radiation exit side of the base body.

In particular, the area of the radiation exit surface of the base body is larger than the main radiation exit surface of the semiconductor layer sequence at least by a factor of 150 or at least by a factor of 200. The main radiation exit surface of the semiconductor layer sequence is the area perpendicular to the epitaxially grown semiconductor layers. This area couples a major part, preferably more than 90% of the radiation generated in the active layer, out of the semiconductor layer sequence.

In particular, the base body has a radiation surface that can be many times larger than that of the semiconductor layer sequence or a semiconductor layer sequence coated with a conversion layer. For example, the radiation surface can be 100 mm$^2$ with a chip area or main radiation exit surface of the semiconductor layer sequence of 0.5 mm$^2$. The radiation density in this arrangement can vary over the surface, for example, by less than or equal to 5%, 4%, 3%, 2% or 1%.

According to at least one embodiment, the base body and the semiconductor layer sequence are embedded in a transparent or reflective housing at least after step C). The housing is thus disposed laterally to the respective base body and the semiconductor layer sequence. In particular, the terminal contact disposed on the mounting rear side is free of the housing. This allows the produced device to be easily mounted on a printed circuit board or substrate.

According to at least one embodiment, the device has a conversion layer. The conversion layer is contiguous with the semiconductor layer sequence in particular. The conversion layer may comprise conversion materials such as inorganic or organic phosphors such as orthosilicates, calsines or nitrides. The conversion layer can be disposed either between the semiconductor layer sequence and the base body or between the semiconductor layer sequence and a carrier. Sapphire or a ceramic, for example, can serve as a carrier.

The base body can, for example, be made of glass or plastic or the materials already listed above, the emission body can be mirrored on the mounting side to the printed circuit board. The mirror coating can be a Bragg, BBR or metallic mirror, for example. The terminal contacts can then be located on the mirror.

If the growth substrate is meant as a carrier for the epitaxial layer, the carrier can also be made of sapphire, SiC, Si, Al$_2$O$_3$, ceramics (also ceramics suitable for the infrared range), glass ceramics or glass. If the carrier is a growth substrate, the carrier can be removed in a so-called thin film process so that the epitaxial layer is on a different material, preferably with the same coefficient of thermal expansion.

The growth substrate can also be completely removed after transfer to the base body. The component can consist of or comprise the base body of the epitaxial layer with contact structures and the border.

Both the base body and the border can be made of any of the materials mentioned above. For example, the base body and/or the border can be made of plastic. In particular, the base body is transparent. The border can be either transparent or non-transparent. The border can also contain the converter. The border can alternatively act as an edge mirror coating.

The conversion layer can contain a matrix material, such as silicone or epoxy, in which the conversion materials are embedded. The conversion materials can be homogeneously or inhomogeneously embedded in the matrix material.

According to at least one embodiment, in step B) the terminal contact only partially covers the at least one mounting side surface. In particular, the terminal contact extends from the mounting side surface to the mounting rear side of the base body. The produced device can, for example, be mounted on a printed circuit board via the rear side of the base body. A filler can be applied to the mounting side surface directly laterally to the terminal contact. The semiconductor layer sequence at least partially covers both the terminal contact and the filler on the mounting side surface. In other words, laterally to the base body, at least part of the terminal contact and the filler are disposed in one plane at or on the mounting side surface of the base body. The semiconductor layer sequence can follow the terminal contact and, optionally, the filler, especially in direct mechanical or electrical contact.

According to at least one embodiment, the semiconductor layer sequence is disposed on a respective carrier. This means in particular that for each semiconductor layer sequence of the respective produced device a separate carrier, e.g., made of sapphire is used. In step C), the semiconductor layer sequence can be or will be disposed between the base body and the carrier.

According to at least one embodiment, the semiconductor layer sequence provided for the respective base body is attached to a common carrier. In other words, the semiconductor layer sequence is epitaxially grown on a carrier such as sapphire. For example, growth can take place over the entire surface of the carrier. In a subsequent method step, the semiconductor layer sequence can be structured. This can be done, for example, using an etching process. This allows structured semiconductor layer sequences to be produced on a common carrier, which can then be used for the corresponding produced devices.

The structured semiconductor layer sequences can be disposed on or mounted to the common carrier on the terminal contact and, optionally, the filler. After step C), at least the common carrier can be singulated. Alternatively, the common carrier can also be singulated before the semiconductor layer sequence is deposited. This can be used to produce a plurality of surface mounted optoelectronic devices, each of which has at least one terminal contact, a radiation-capable semiconductor layer sequence and a base body.

"Radiation-capable semiconductor layer sequence" herein means that the semiconductor layer sequence generates radiation in the active region at least during operation and decouples it from the semiconductor layer sequence at least via the main radiation exit surface. The radiation decoupled from the main radiation exit surface can be coupled into the base body and can reach the outside of the device via the radiation exit side of the base body.

According to at least one embodiment, the semiconductor layer sequence provided for the respective base body is attached to a common carrier. After step C), the produced arrangement can be encapsulated with a plastic frame. For example, PE, PET, PBT, PMMA, PA, PC, PE, PP, PS, PVC, PEEK, LCP, F-Polymer, PEI, PI, PBS, PSU and HT-PA can be used as plastics. These abbreviations are common abbreviations for plastics and are therefore not explained here.

This means that either the entire arrangement created in step C) can be embedded in the plastic frame or only the common carrier can remain free of the plastic frame. In other words, at least the base body, the terminal contact and the semiconductor layer sequence are embedded in a plastic frame, whereby the carrier is not embedded by the plastic frame and can, for example, be removed again in a subsequent process.

Whether an element or layer is disposed "at" or "on" another element or layer may mean here that the arrangement may be direct or indirect.

According to at least one embodiment, the device has a reflective housing. The reflective housing surrounds the base body and the semiconductor layer sequence in a frame-like manner. Preferably the plastic frame can form the housing.

According to at least one embodiment, the semiconductor layer sequence is disposed between the mounting side surface and the terminal contact and/or directly on the mounting side surface.

According to at least one embodiment, the terminal contact between the mounting side surface and the semiconductor layer sequence is disposed directly and/or indirectly on the mounting side surface.

According to at least one embodiment, the base body is made of glass. Alternatively or additionally, the reflective housing is made of silicone and titanium dioxide.

According to at least one embodiment, the housing has a thickness (chip edge length) of less than or equal to 0.5 mm, in particular less than or equal to 0.4 mm, preferably less than or equal to 0.3 mm. The housing is therefore extremely thin, despite the lateral expansion.

According to at least one embodiment, the contact connection has a thickness. The contact connection can be disposed between the semiconductor chip and the base body. The thickness of the contact connection can be configured so that the semiconductor chip is disposed a few μm, for example, 5 μm, away from the base body. This allows the optical beam path and the optical coupling behavior to be configured in the base body.

The filler can be a converter, a transparent compound, such as silicone, or an unfilled gap, the height of which can be advantageously configured. The back of the light-emitting element can be mirrored independently of the border.

According to at least one embodiment, the device does not have a border. Alternatively, the device can have a metal border.

According to at least one embodiment, the semiconductor chip height is smaller than the device height. The semiconductor layer sequence can be located in the frame below the surface.

According to at least one embodiment, the housing is scratch and abrasion resistant. In particular, the surface or top side of the housing is scratch and abrasion resistant. "Top side" here means the side which lies in one plane, especially with the radiation exit side of the base body.

Crosstalk can be prevented by surrounding the embodiment with a metal or reflective plastic, for example. Crosstalk can be achieved by omitting the edge coating.

With the method described herein, a device with a flexible design can be produced. For example, glass foils with thicknesses from 30 μm to approx. 1 mm can be used as the base body. Alternatively, plastic foils can also be used as the base body.

The conversion layer can also contain glass as a matrix material. The conversion material can be embedded in the glass. Alternatively, the conversion material can be disposed as a layer on the glass matrix. The conversion layer can be applied using the usual method, for example, a molding process.

The inventor has recognized that with the method described herein, the device described herein can be provided in a super-flat SMT housing that is flexible and abrasion-resistant.

A flexible glass or plastic housing can be used. In addition, there is no glare effect, as is the case with LED point light sources, as the radiation surface is homogeneously illuminated.

An improved current carrying capacity and distribution with simultaneous enlargement of the decoupling area is possible when using the described method. The SMT design is possible as a new design for almost seamless assembly and thus in a wide range of applications. The size is individually scalable.

In various embodiments, the devices produced here are based on so-called hybrid technology and have potential efficiency advantages. It is therefore a newly emerging technology.

BRIEF DESCRIPTION OF THE DRAWINGS

Further advantages, embodiments and developments of the invention can be derived from the following description of the exemplary embodiments in connection with the figures.

In the figures.

In the exemplary embodiments and figures, identical, similar or equivalent elements can each be provided with the same reference signs. The elements shown and their proportions are not to be regarded as true to scale. Rather, individual elements, such as layers, components, devices and areas, can be displayed in an exaggeratedly large format for better representability and/or better understanding.

DETAILED DESCRIPTION OF ILLUSTRATIVE EMBODIMENTS

FIGS. 1A to 1E show a method for manufacturing a plurality of surface mounted optoelectronic devices 100 according to an embodiment. This is where a so-called chip-to-wafer assembly takes place.

Figure 1A:
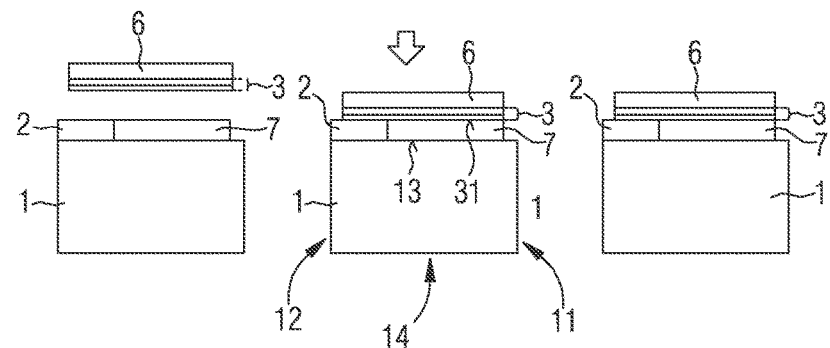
FIGS. 1A to 1E show a method for manufacturing a plurality of devices according to an embodiment.

FIG. 1A shows the provision of a plurality of transparent base bodies 1. The transparent base bodies 1 each have a mounting rear side 12, a radiation exit side 11 opposite the mounting rear side and, in particular, two mounting side surfaces 13 and 14. The mounting side surfaces 13, 14 are each disposed transversely to the radiation exit side 11. In this example, the semiconductor layer sequence 3 is mounted on the respective base body 1. The semiconductor layer sequence 3 can be attached to a carrier 6, e.g., made of sapphire. At least one terminal contact 2 can be disposed between the semiconductor layer sequence 3 and the base body 1.

Optionally, a filler 7 can be disposed laterally to terminal contact 2 to compensate for height differences up to semiconductor layer sequence 3. Filler 7, for example, is a converter, a transparent compound such as silicone, or an unfilled gap. The terminal contact 2 is disposed laterally to the filler 7 on at least one mounting side 13.

Figure 1B:
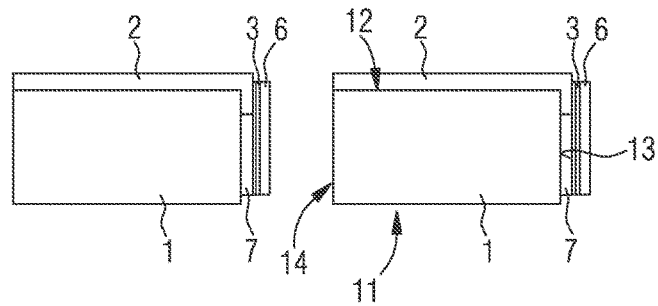

Then, as shown in FIG. 1B, the respective base bodies 1 can be rotated and the terminal contact 2 can be produced on the rear of the mounting rear side 12. In particular, the terminal contact 2 covers the entire mounting rear side 12. A photolithography can be carried out before manufacturing the back-side contact 2 and after turning the base body 1.

The method described herein thus shows the deposition of a semiconductor layer sequence 3 or a semiconductor chip on a wafer. The wafer can be made of glass and have elongated holes, for example.

Figure 1C:
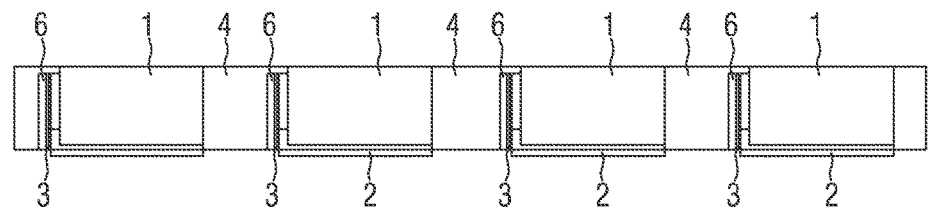

According to FIG. 1C, the distance from adjacent produced arrangements can be increased according to FIG. 1B, i.e., expanded, and a housing 4 can be produced. The housing 4 forms an outer shell of the arrangement. The outer shell can, for example, be produced by molding. The resulting housing 4 can be transparent or reflective. Silicone with dispersed particles, such as titanium dioxide or zirconium dioxide, can be used as a reflective medium.

A plastic foil or glass foil, for example, a glass D263 from Schott, can be used as the glass body.

Alternatively, a ceramic can also be used as a base body.

Figure 1D:
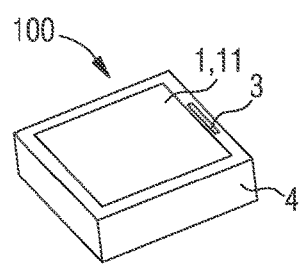

FIG. 1D shows a top view of a produced device 100. In this case, the device has a reflective housing 4 that surrounds the base body 1 and the semiconductor layer sequence 3 in a frame-like manner. During operation, the semiconductor layer sequence can decouple radiation from device 100 via the radiation exit side 11 of base body 1.

Figure 1E:
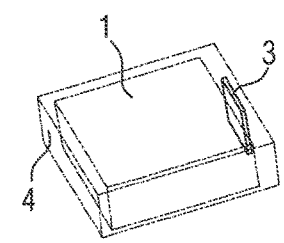

Alternatively, as shown in FIG. 1E, the housing can also be transparent.

The geometry of the border can be varied, resulting in extended systems with an enclosed chip or semiconductor layer sequence 3.

FIGS. 2A to 2G show a method for manufacturing a plurality of devices according to one embodiment. Here a so-called wafer-to-wafer assembly takes place.

Figure 2A:
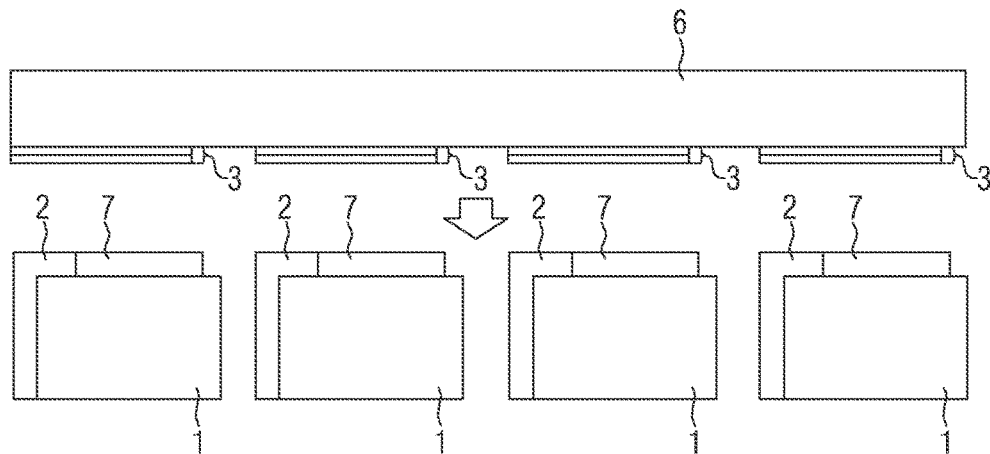
FIGS. 2A to 2G show a method for manufacturing a plurality of devices according to an embodiment.

As shown in FIG. 2A, a plurality of transparent base bodies 1 is provided and the terminal contact 2 is produced both on the mounting side surface 13 and on the mounting rear side 12.

Filler 7 may be available as an option. In contrast to the manufacturing method of FIGS. 1A to 1E, here the semiconductor layer sequences 3 with a carrier 6 are not deposited separately on the respective device, but the respective semiconductor layer sequences 3 are disposed on a common carrier 6. The carrier can be made of sapphire, for example.

The manufacturing of the arrangement of semiconductor layer sequence 3 and carrier 6 can be done as follows.

A carrier 6 can be provided on which the semiconductor layer sequence 3 is produced over the entire surface. In a subsequent method step, the semiconductor layer sequence 3 can be structured so that different areas of semiconductor layer sequences 3 are produced, which are provided for the respective base bodies 1.

The respective semiconductor layer sequences 3 are placed on the mounting side surface 13 of the respective base body 1. Between the semiconductor layer sequence 3 and the base body, the terminal contact 2 and, optionally, the filler 7 are thus disposed (FIG. 2B).

Figure 2B:
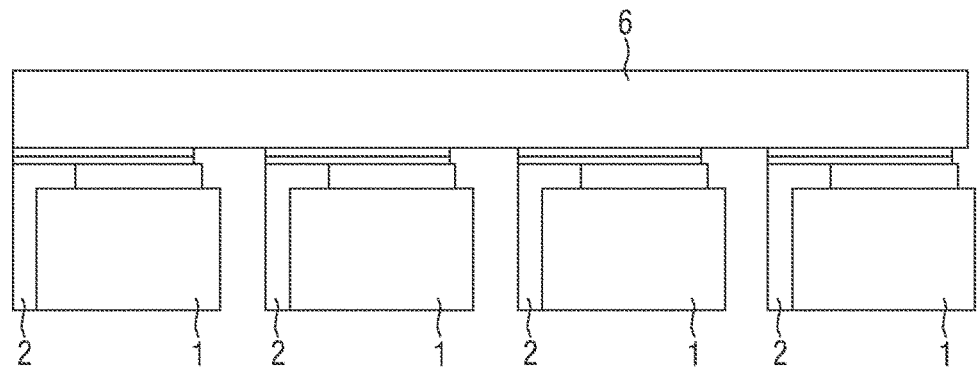
Figure 2C:
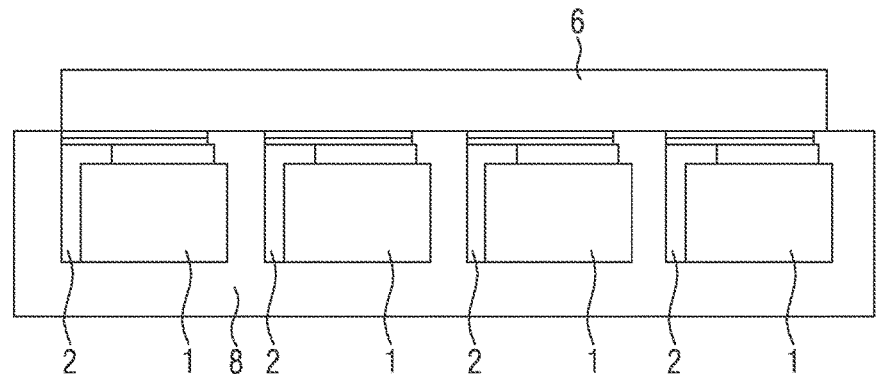

In the subsequent method step, as shown in FIG. 2C, the arrangement of FIG. 2B can be surrounded by a plastic frame 8. The plastic frame 8 can be transparent. Alternatively, the plastic frame 8 can also contain titanium dioxide particles as scattered particles.

FIG. 2C shows that the carrier 6 is not embedded in the plastic frame 8 in a material and form-fitting manner.

Figure 2D:
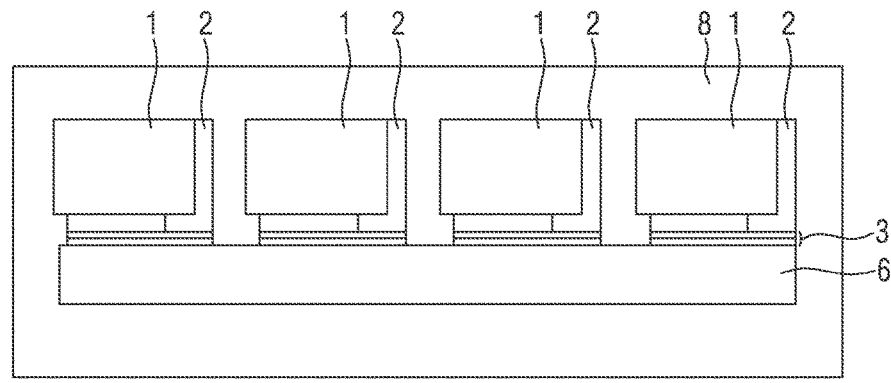

In contrast to this, as shown in FIG. 2D, the plastic frame 8 can also completely embed the carrier 6.

Alternatively, the carrier 6 can also be singulated before the plastic frame 8 is produced, thus producing a plurality of optoelectronic devices.

FIG. 2C shows the separation of the carrier and/or the plastic frame 8 only after the plastic frame 8 has been inserted. The method steps can also be reversed. The plastic frame 8 can also form the housing 4.

Figure 2E:
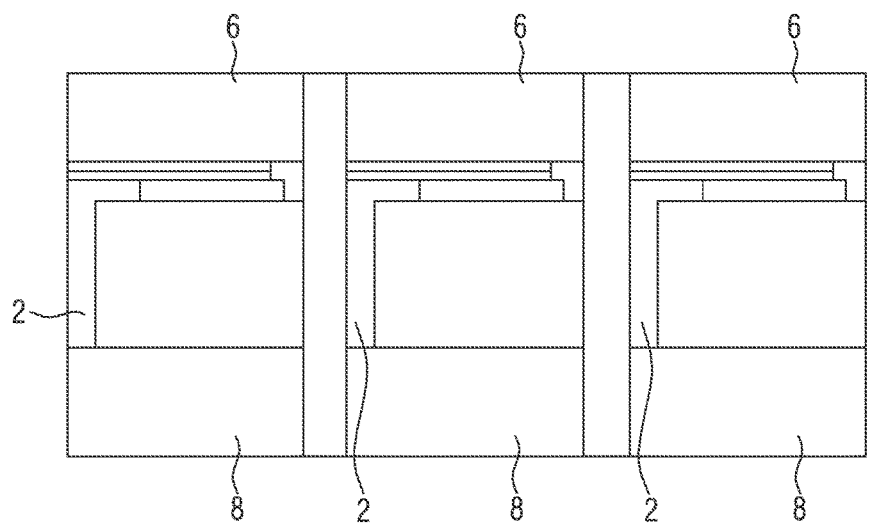

For the devices of FIGS. 2C to 2E, the terminal contact 2 is disposed transversely to the carrier 6. Alternatively, the devices can also be turned before being inserted into a plastic frame 8 so that the terminal contact 2 extends downwards out of the plastic frame 8 and can therefore be easily mounted on a printed circuit board.

Figure 2F:
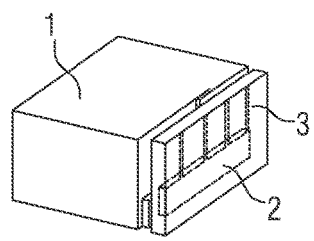

FIG. 2F shows a schematic side view of a produced device with a semiconductor layer sequence 3, the terminal contact 2 or the terminal contacts 2 and the base body 1.

Figure 2G:
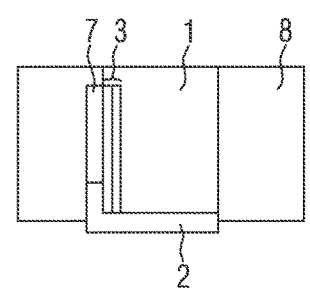

FIG. 2G shows a schematic side view of a device 100, in which the mounting side surfaces 13, 14 of the base body 1 are surrounded by the plastic frame 8. The radiation exit side 11 of the base body 1 is free of the plastic frame 8. In addition, the mounting rear side 12 of the base body 1 is free of the plastic frame 8, so that the terminal contact 2 is free and this device can be easily mounted on a printed circuit board, for example.

Figure 3A:
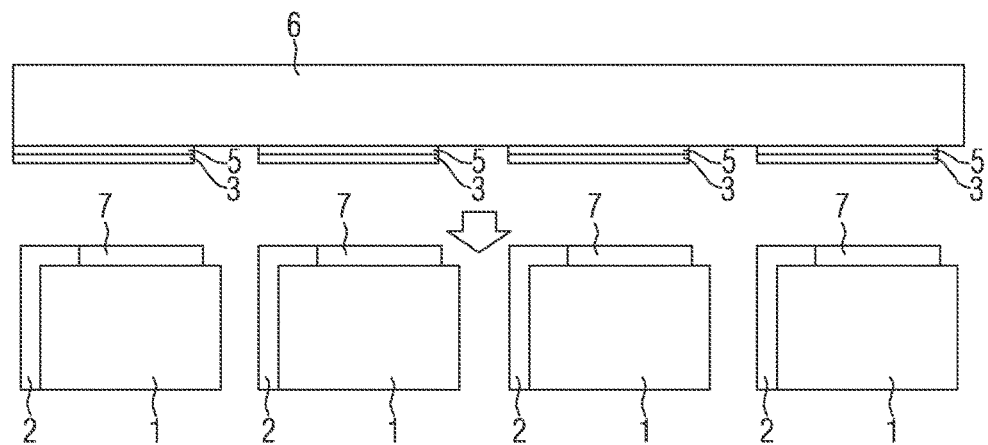
FIGS. 3A to 3C show a method for manufacturing a plurality of devices according to an embodiment.
Figure 3B:
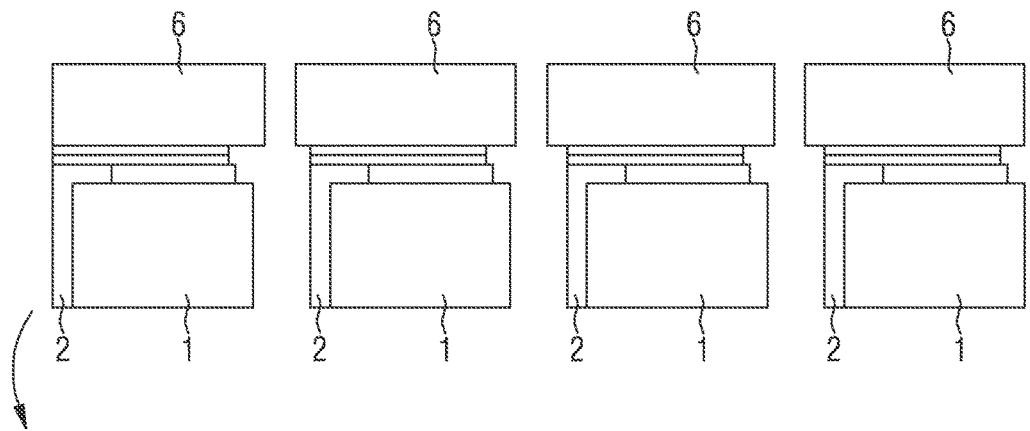
Figure 3C:
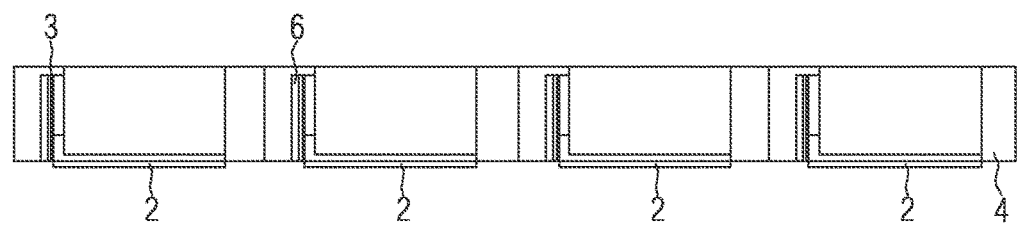

FIGS. 3A to 3C show a method for manufacturing a plurality of devices according to one embodiment. This method corresponds essentially to the method of FIGS. 2A to 2G, with the exception that here an additional conversion layer 5 is also present in the arrangement. Conversion layer 5 can be disposed between carrier 6 and semiconductor layer sequence 3. Alternatively, conversion layer 5 can also be disposed between terminal contact 2 and semiconductor layer sequence 3 (not shown here).

Conversion layer 5 can be produced by conventional techniques such as molding, dispensing or spraying.

Figure 4A:
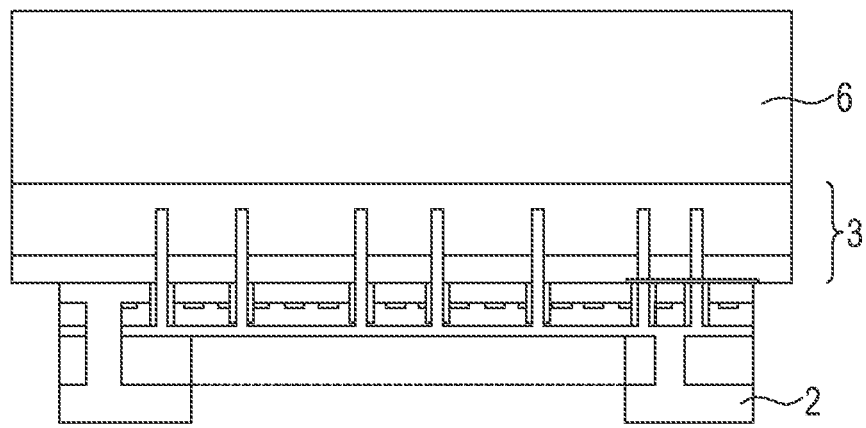
FIGS. 4A and 4B show a schematic side view and a top view of a device according to an embodiment.

FIG. 4A shows a schematic side view of a semiconductor layer sequence 3 disposed on a carrier 6 made of sapphire, for example. The semiconductor layer sequence 3 can be electrically contacted by means of terminal contacts. In particular, the semiconductor layer sequences may have 3 vias. The structure described here can also be referred to as a UX:3 structure. The device can also have fan-in and fan-out UX:3 structures. Mirrors or other contacts may also be present in the device.

Figure 4B:
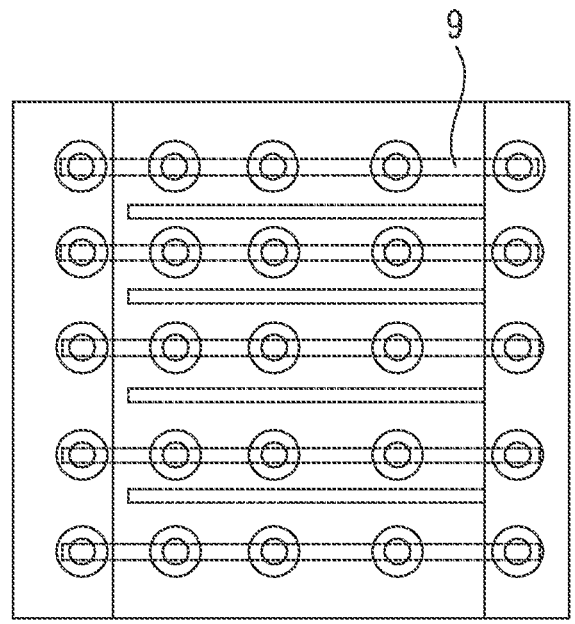

FIG. 4B shows connecting webs 9 of a plan view of a device according to an embodiment.

Figure 5:
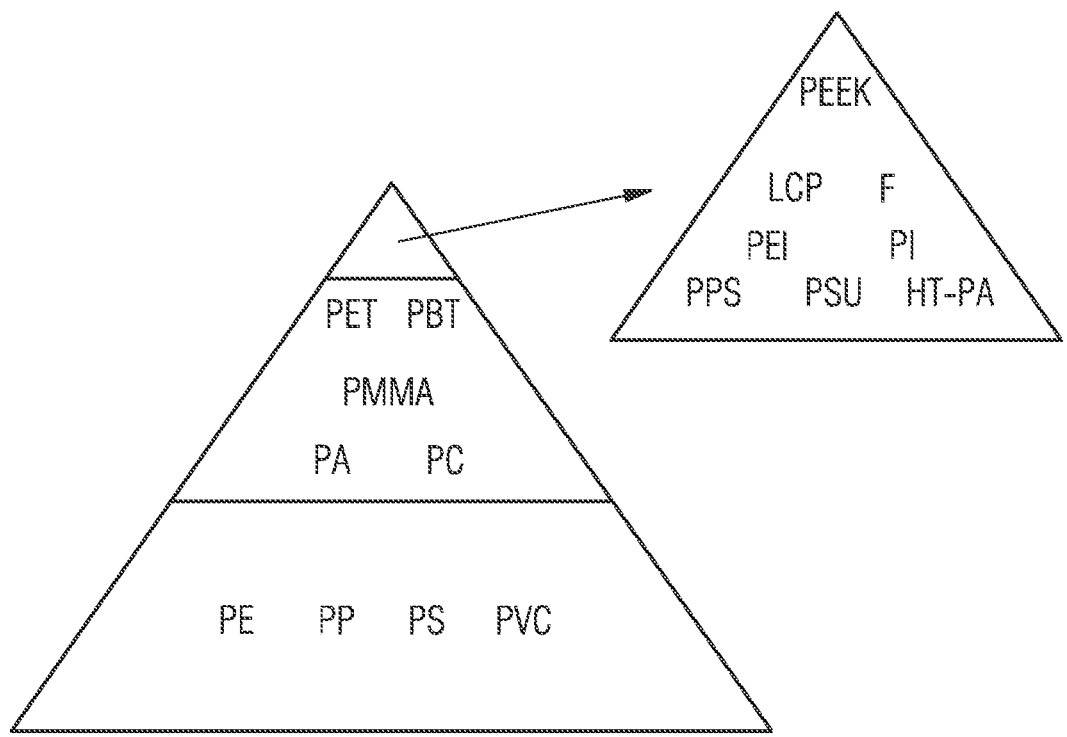
FIG. 5 shows materials for a housing or base body.

FIG. 5 shows possible materials that can be used for a base body 1 and/or plastic frame 8 and/or housing 4. High-temperature plastics such as PEEK, LCP, F-polymer (abbreviated to F in FIG. 5), PEI, PI, PPS, PSU and HT-PA can be used. Alternatively, technical plastics such as PET, PBT, PMMA, PA, PC or standard plastics such as PE, PP, PS and PVC can be used. Alternatively, thermosets and silicones can also be used. The abbreviations are known to the expert and are therefore not explained here. The possibilities are extendable by converters on chip and a lower current supply and/or by a lower whiter radiation density.

FIGS. 6A to 6D each show schematic top views or side views of a device according to an embodiment.

Figure 6A:
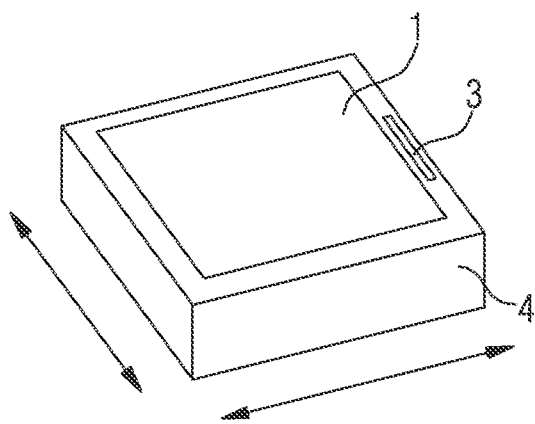
FIGS. 6A to 6D show side views or top views of devices according to an embodiment.

FIG. 6A shows the base body 1 embedded in a housing 4 with the semiconductor layer sequence 3 disposed laterally to the base body 1.

Figure 6B:
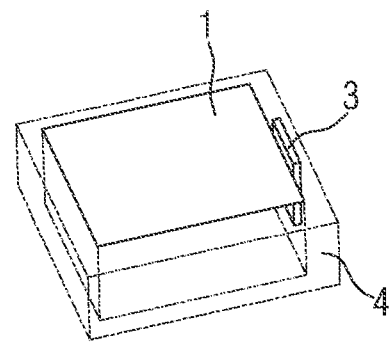

FIG. 6B shows the embodiment of a transparent housing 4, whereas FIG. 6A shows a reflective housing.

Figure 6C:
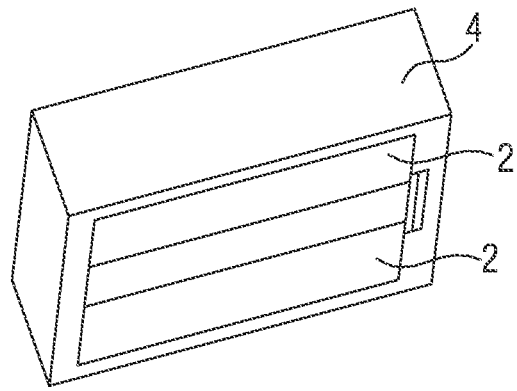

FIG. 6C shows a bottom view, i.e., the arrangement of the terminal contacts 2, on the mounting side surface 13 of the base body 1. In this case, the housing 4 is formed reflectively.

Figure 6D:
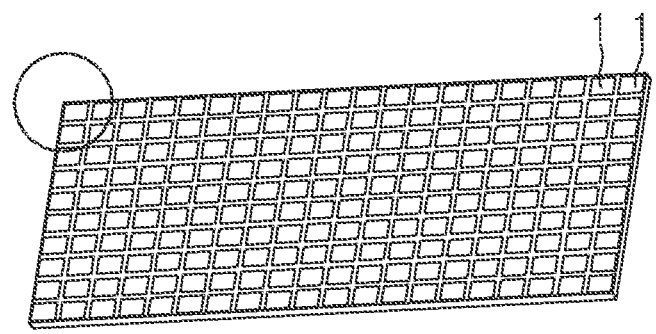

FIG. 6D shows the arrangement of a plurality of devices as a so-called matrix display.

Figure 7A:
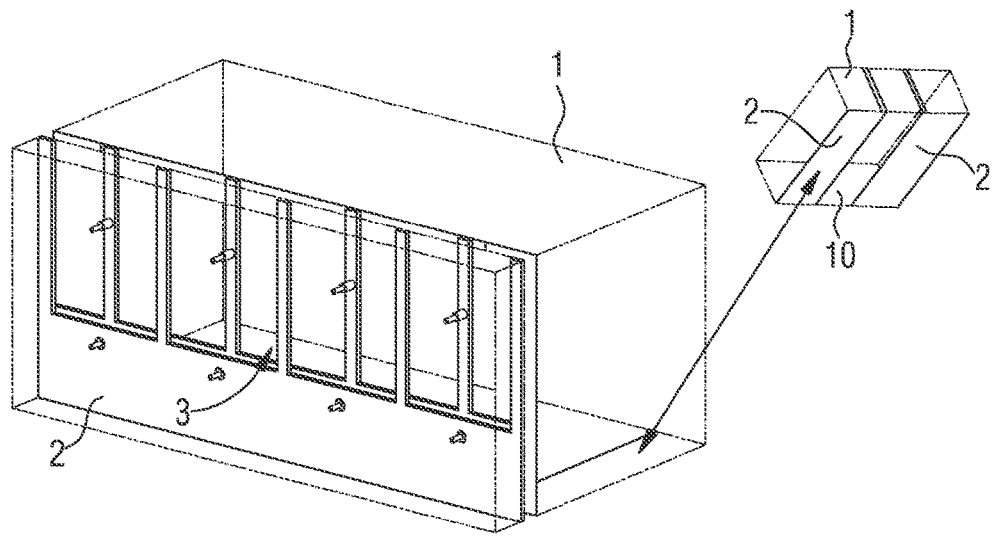
FIGS. 7A and 7B show side views and top views of devices according to an embodiment.
Figure 7B:
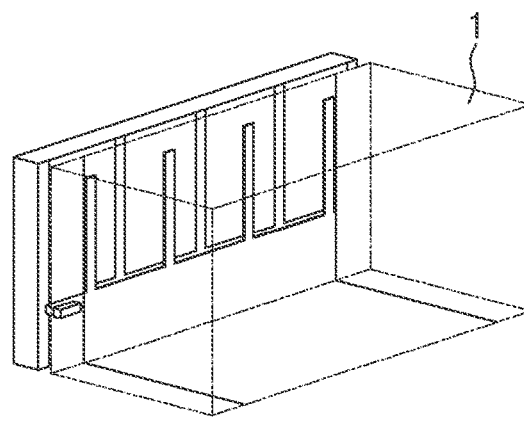

FIGS. 7A and 7B show a schematic side view of a device according to an embodiment.

FIG. 7A shows a transparent base body 1, which has a connection area, i.e., several terminal contacts 2, and so-called fan-out UX:3 structures. A mirror to can be disposed between the terminal contacts 2.

FIG. 7B shows a corresponding rotation of the device of FIG. 7A, i.e., for a better representation of the base body 1.

Figure 8A:
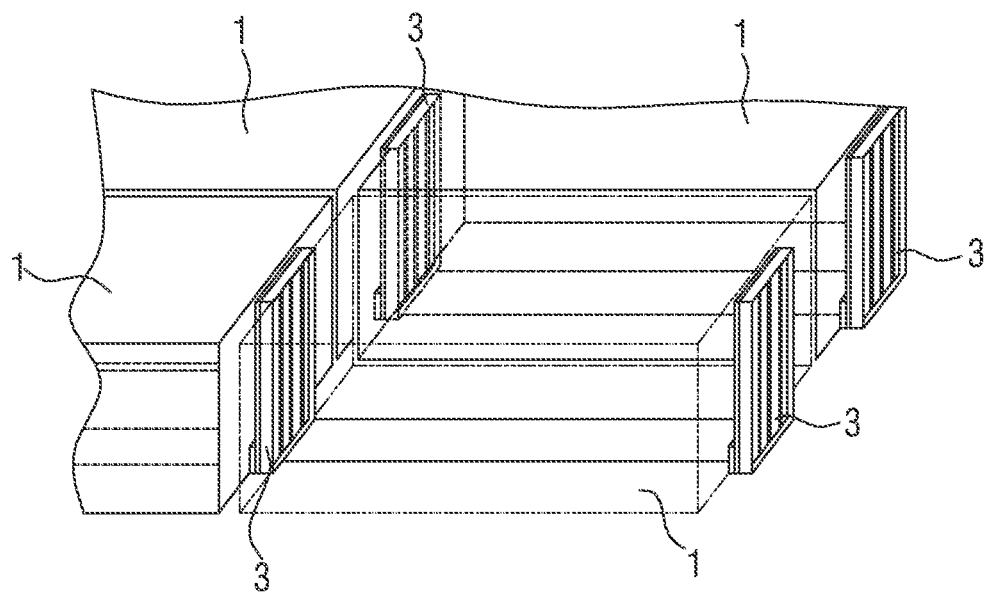
FIGS. 8A to 8D show side views or top views of devices according to an embodiment.
Figure 8B:
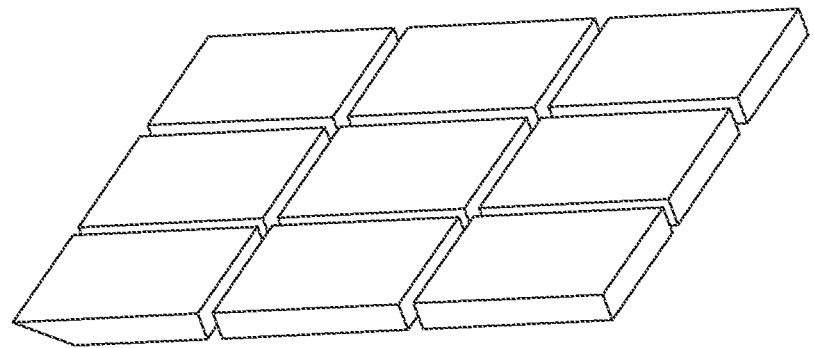
Figure 8C:
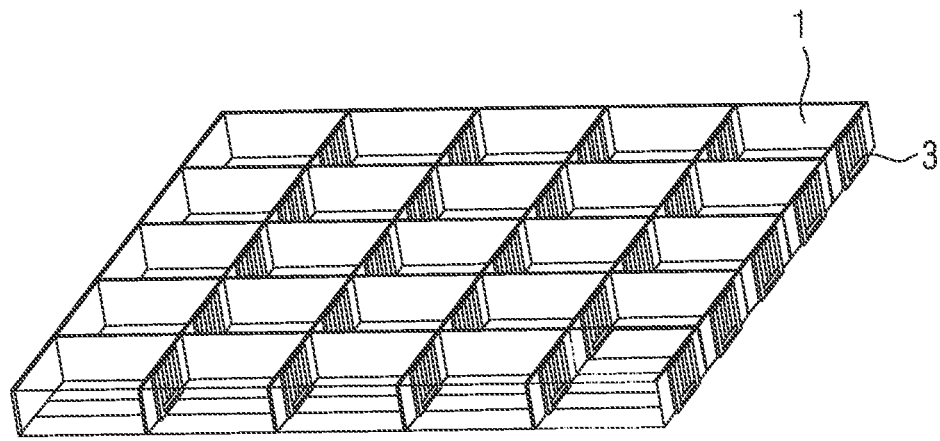
Figure 8D:
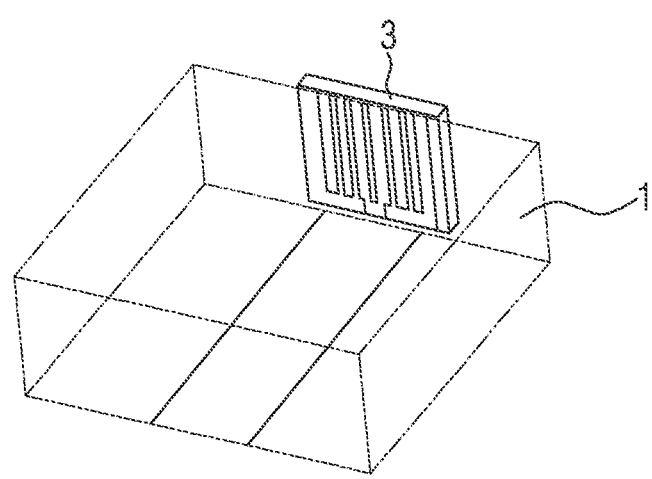

FIGS. 8A to 8D show an embodiment of a device. Here, the respective devices are designed as homogeneously illuminated, large-area LED elements. The devices can therefore be disposed as a display or matrix. Each device has a base body 1, at least one semiconductor layer sequence 3 and terminal contacts 2 (FIGS. 8A and 8C). The individual devices can emit the same or different radiation (FIG. 8B). FIG. 8D shows a single device 100.

Figure 9A:
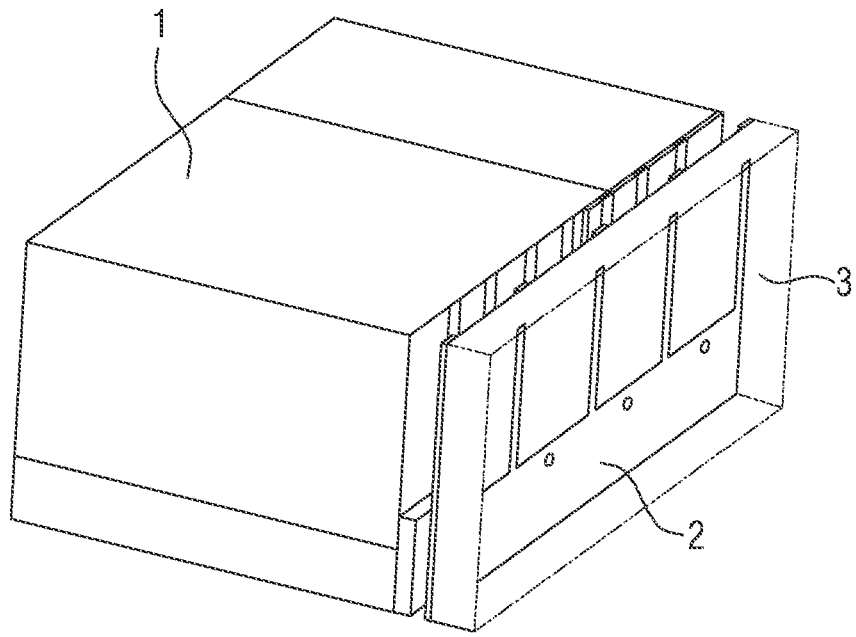
FIGS. 9A and 9B show side views and top views of a device according to an embodiment.
Figure 9B:
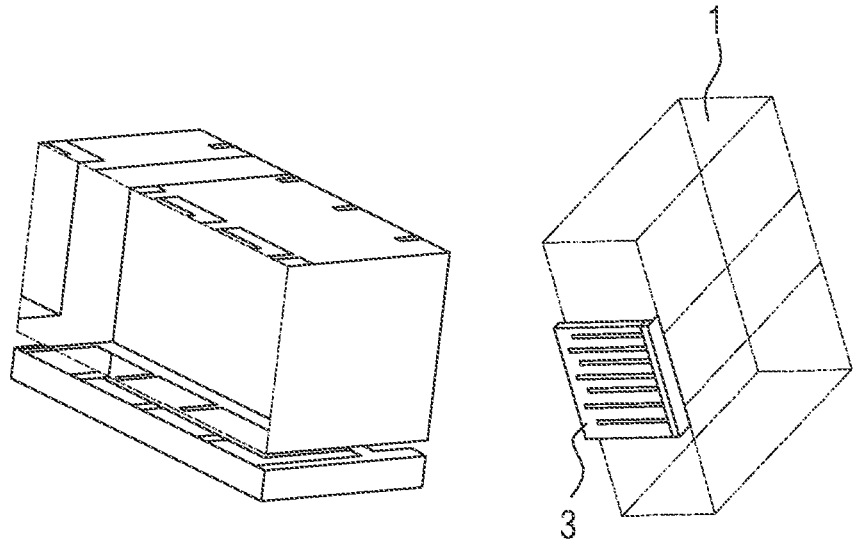

FIGS. 9A and 9B show different views of a device 100 according to one embodiment.

Figure 10A:
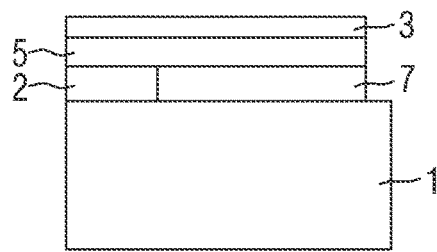
FIGS. 10A to 10C show schematic side views of a device according to an embodiment.
Figure 10B:
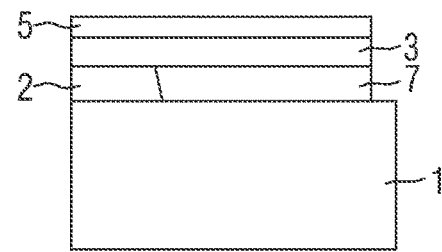
Figure 10C:
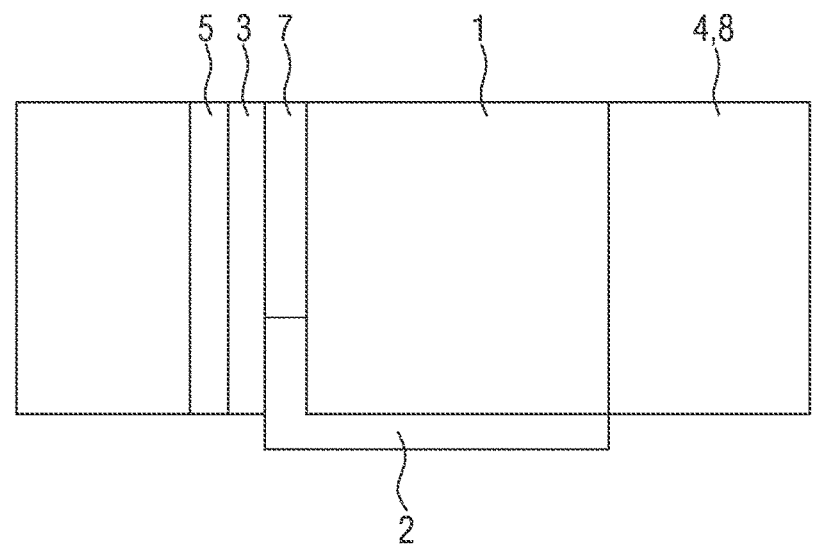

The FIGS. 10A to 10C each show a schematic side view of a device 100 according to an embodiment.

The respective device 100 has a base body 1, at least one terminal contact 2 on the mounting side surface 13, optionally a filler 7, a conversion layer 5 and a semiconductor layer sequence 3.

As shown in FIG. 10A, conversion layer 5 can be disposed directly on the terminal contact 2.

Alternatively, the semiconductor layer sequence 3 can also be disposed between the conversion layer 5 and the terminal contact 2 (as shown in FIG. 10B).

The device of FIG. 10C shows a base body 1 with a terminal contact 2, which extends at least from the mounting side surface 13 to the mounting rear side 12. Optionally, a filler 7 may be present. A semiconductor layer sequence 3 and a conversion layer 5 can be disposed laterally to the base body 1. This arrangement can be surrounded by a frame-like housing 4 or plastic frame 8. The materials described above can be used for the materials of the housing, the plastic frame, the base body, the filler, the terminal contact, the semiconductor layer sequence and the conversion layer.

The exemplary embodiments described in connection with the figures and their characteristics can also be combined with each other according to further exemplary embodiments, even if such combinations are not explicitly shown in the figures. Furthermore, the exemplary embodiments described in connection with the figures may have additional or alternative features as described in the general part.

The invention is not limited by the description of the exemplary embodiments. Rather, the invention includes any new feature, as well as any combination of features, which in particular includes any combination of features in the patent claims, even if that feature or combination itself is not explicitly stated in the patent claims and exemplary embodiments.

The invention claimed is:

1. A method for manufacturing a plurality of surface mounted optoelectronic devices, the method comprising:
   providing a plurality of transparent base bodies, each base body having a mounting rear side, a radiation exit side opposite the mounting rear side, and mounting side surfaces each disposed transversely to the radiation exit side;
   depositing a terminal contact on at least one mounting side surface and the mounting rear side of a respective base body so that a device is surface-mountable, the terminal contact being arranged to electrically contact a semiconductor layer sequence; and
   depositing the semiconductor layer sequence on at least one mounting side surface of the respective base body, wherein the semiconductor layer sequence is arranged for emitting electromagnetic radiation so that the electromagnetic radiation is decoupled from the device during operation via the radiation exit side of the base body.

2. The method according to claim 1, further comprising embedding the base body and the semiconductor layer sequence in a transparent or reflective housing so that the transparent or reflective housing is disposed laterally to the respective base body and the semiconductor layer sequence, wherein the terminal contact disposed on the mounting rear side is free of the transparent or reflective housing.

3. The method according claim 1, further comprising arranging a conversion layer in direct contact with the semiconductor layer sequence and so that it is located between the semiconductor layer sequence and the base body or between the semiconductor layer sequence and a carrier.

4. The method according to claim 1, wherein depositing the terminal contact comprising depositing the terminal contact so that it only partially covers the mounting side surface, wherein a filler is applied directly laterally to the terminal contact at or on the mounting side surface, and wherein the semiconductor layer sequence at least partially covers both the terminal contact and the filler on the mounting side surface.

5. The method according to claim 1, wherein the semiconductor layer sequence is disposed on a respective carrier, and wherein depositing the semiconductor layer sequence comprises depositing the semiconductor layer sequence between the base body and the carrier.

6. The method according to claim 1, wherein semiconductor layer sequences for the base bodies are attached to a common carrier which is singulated so that the plurality of surface mounted optoelectronic devices is produced, each surface mounted optoelectronic device having at least one terminal contact, a radiation-capable semiconductor layer sequence and a base body.

7. The method according to claim 1, wherein semiconductor layer sequences for the base bodies are attached to a common carrier so that an arrangement is produced, wherein the arrangement is encapsulated with a plastic frame so that the entire arrangement is embedded in the plastic frame or only the common carrier remains free of the plastic frame.

8. The method according to claim 1, wherein the terminal contact is in direct contact with the at least one mounting side surface and the mounting rear side of the respective base body.

9. A surface mounted optoelectronic device comprising:
a transparent base body having a mounting rear side, a radiation exit side opposite the mounting rear side, and mounting side surfaces which are each disposed transversely to the radiation exit side;
a semiconductor layer sequence disposed laterally to at least one mounting side surface; and
a terminal contact extending from the at least one mounting side surface to the mounting rear side,
wherein the semiconductor layer sequence includes an active region configured to emit radiation so that the radiation decouples from the surface mounted optoelectronic device via the radiation exit side of the base body.

10. The surface mounted optoelectronic device according to claim 9, further comprising a reflective housing surrounding the base body and the semiconductor layer sequence in a frame-like manner.

11. The surface mounted optoelectronic device according to claim 10, wherein the base body comprises glass and the reflective housing comprises silicone and titanium dioxide.

12. The surface mounted optoelectronic device according to claim 10, wherein the reflective housing has a thickness of less than 0.5 mm.

13. The surface mounted optoelectronic device according to claim 10, wherein the terminal contact is in direct contact with the at least one mounting side surface and the mounting rear side.

14. The surface mounted optoelectronic device according to claim 9, wherein the semiconductor layer sequence is disposed between the mounting side surface and the terminal contact and directly on the mounting side surface.

15. The surface mounted optoelectronic device according to claim 9, wherein the terminal contact is disposed between the mounting side surface and the semiconductor layer sequence and directly on the mounting side surface.

16. The surface mounted optoelectronic device according to claim 9, wherein the base body comprises plastic, ceramic or glass.

17. The surface mounted optoelectronic device according to claim 9, wherein a surface of the radiation exit side of the base body is at least 150 times larger than a main radiation exit surface of the semiconductor layer sequence.

* * * * *